United States Patent
Eu et al.

(10) Patent No.: US 8,198,143 B2
(45) Date of Patent: Jun. 12, 2012

(54) MOLD AND SUBSTRATE FOR USE WITH MOLD

(75) Inventors: Poh Leng Eu, Petaling Jaya (MY); Boon Yew Low, Petaling Jaya (MY); Wai Keong Wong, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/097,066

(22) Filed: Apr. 29, 2011

(65) Prior Publication Data

US 2011/0244637 A1    Oct. 6, 2011

Related U.S. Application Data

(62) Division of application No. 12/269,058, filed on Nov. 12, 2008, now Pat. No. 7,956,471.

(51) Int. Cl.
*H01L 21/00* (2006.01)
(52) U.S. Cl. ................ 438/127; 257/E21.502
(58) Field of Classification Search .......... 257/E21.502; 438/629, 112, 124, 126–127, 637, 640, 667
See application file for complete search history.

(56) References Cited

U.S. PATENT DOCUMENTS

| 6,013,947 | A | * | 1/2000 | Lim ........................ 257/685 |
| 6,246,115 | B1 | | 6/2001 | Tang et al. |
| 7,141,886 | B2 | | 11/2006 | Dimaano, Jr. et al. |
| 2005/0017354 | A1 | | 1/2005 | Paul |
| 2009/0045529 | A1 | | 2/2009 | Kazama |

FOREIGN PATENT DOCUMENTS

JP    2004228123    8/2004

* cited by examiner

*Primary Examiner* — Hoa B Trinh
(74) *Attorney, Agent, or Firm* — Charles Bergere

(57) ABSTRACT

A mold (10) including a first mold part (12) and a second mold part (14) define a mold cavity (16) therebetween. A gate (18) is formed in at least one of the first and second mold parts (12) and (14) such that the gate (18) communicates with the mold cavity (16). A vent (20) having a constricted portion (22) is arranged to communicate with the mold cavity (16). A substrate (28) including a base substrate (30) and an electrically conductive pattern (32) and (34) formed on the base substrate (30) may be received in the mold (10). A solder resist layer (36) is formed on the base substrate (30) and a portion of the electrically conductive pattern (32). A plurality of grooves (38) and (40) is formed in a staggered arrangement around a periphery of a molding area (42) on the substrate (28).

5 Claims, 3 Drawing Sheets

US 8,198,143 B2

MOLD AND SUBSTRATE FOR USE WITH MOLD

This application is a divisional of U.S. application Ser. No. 12/269,058 entitled "Mold and Substrate for Use with Mold" filed on Nov. 12, 2008.

BACKGROUND OF THE INVENTION

The present invention relates to the packaging of integrated circuits (ICs) and more particularly to a mold and a substrate for use in a center gate molding operation.

At present, a number of different molds for center gate molding applications are available in the market. These include air vents for releasing air which is driven out of the mold cavity during the molding operation. Certain air vent designs include air vent holes which are through-holes extending through one of the mold parts.

However, molds with air vent holes require frequent cleaning, for instance, once every six hundred mold shots. The requirement for frequent cleaning makes such molds impractical for use in mass production.

Other mold designs do not include air vent holes but instead are either provided with small air vent reliefs in between solder pad areas or a full relief area around the mold cavity. However, provision of small air vent reliefs in between solder pad areas increases the risk of resin bleed onto solder pads in the event of solder pad offset arising from lapses in substrate manufacturing precision. On the other hand, provision of a full relief area around the mold cavity reduces the substrate area available for clamping and consequently increases the incidence of solder mask cracks due to the increased clamping pressure experienced by the substrate arising from application of the same clamping force on a smaller clamping area.

Furthermore, current substrate designs for center gate molded ball grid array (BGA) packages are susceptible to resin bleed and thus often fail the visual inspection criteria.

In view of the foregoing, a need exists for a mold and a substrate that improve center gate molding process robustness and resultant package reliability, and that can be used for mass production.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
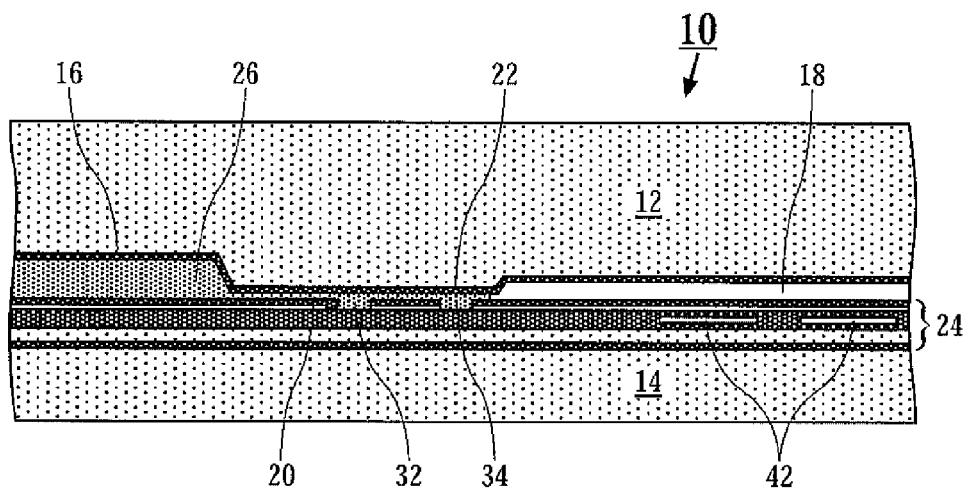
FIG. 1 is an enlarged cross-sectional view of a portion of a mold in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a substrate including a base substrate and an electrically conductive pattern formed on the base substrate. A solder resist layer is formed on the base substrate and a portion of the electrically conductive pattern. A plurality of grooves is formed in a staggered arrangement around at least portion of a periphery of a molding area on the substrate.

The present invention further provides a method of packaging an integrated circuit (IC) die including the steps of attaching and electrically connecting the IC die to a substrate having a plurality of grooves formed thereon around the periphery of a molding area. The IC die and the substrate are placed in a mold having a plurality of mold parts. A vent extending away from the mold cavity is defined between the mold parts, and at least some of the grooves on the substrate intersect with the vent. The IC die and the molding area of the substrate are covered with a mold compound.

The present invention further provides a mold for encapsulating an integrated circuit device with mold compound including a first mold part and a second mold part. A mold cavity is defined between the first and second mold parts. A gate is formed in at least one of the first and second mold parts such that the gate communicates with the mold cavity. A vent is defined between the mold parts and extends from the mold cavity to the outside of the mold. The vent has a constricted portion arranged to communicate with the mold cavity. Optionally, there may be a plurality of vents.

Referring now to FIG. 1, an enlarged cross-sectional view of a portion of a mold 10 is shown. The mold 10 includes a first mold part 12 and a second mold part 14. A mold cavity 16 is defined between the first and second mold parts 12, 14. One or more vents 18, one of which is shown in FIG. 1, are defined between the first and second mold parts 12, 14. The vent 18 extends from the mold cavity 16 to the outside of the mold 10 and includes a constricted portion 20 that communicates with the mold cavity 16. The separation between the opposing faces of the respective mold parts 12, 14 is less in the constricted portion 20 of the vent 18 than in other portions of the vent 18. In the embodiment shown, the constricted portion 20 comprises a stepped portion 22 formed in the first mold part 12. A substrate 24 is received in the mold 10 and a portion of the substrate 24 is covered with a mold compound 26.

The mold 10 may be formed of steel using a conventional mold forming process, as is known in the art. In one embodiment, the mold 10 may have a dimension of about 35 millimeters (mm) by 35 mm. It should however be understood that the present invention is not limited by the material from which the mold 10 is formed or by the dimensions of the mold 10.

Figure 2:
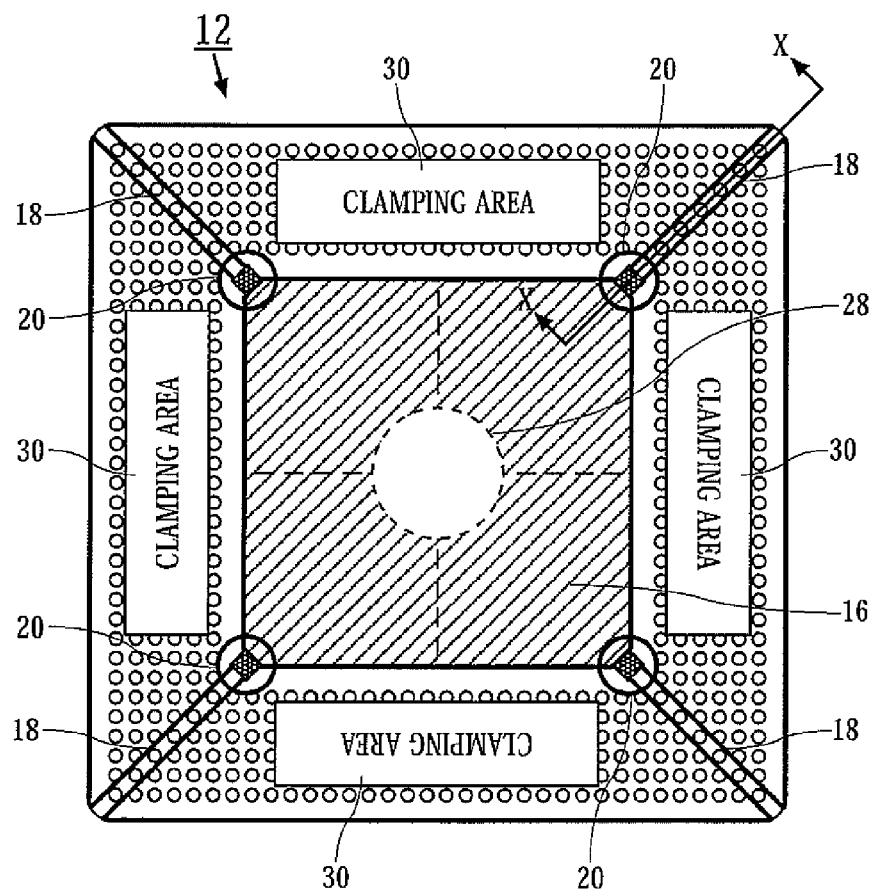
FIG. 2 is a schematic plan view of a first mold part in accordance with an embodiment of the present invention.

Referring now to FIG. 2, a schematic plan view of the first mold part 12 of FIG. 1 is shown. A gate 28 is formed in the first mold part 12, the gate 28 communicating with the mold cavity 16. A plurality of clamping areas 30 is disposed along a periphery of the mold 10 between the vents 18 and away from the molding area 16.

The gate 28 serves as an inlet for the addition of mold compound 26 into the mold cavity 16. In the embodiment shown, the gate 28 opens into a central portion of the mold cavity 16.

The vents 18 serve as an outlet for releasing air from the mold cavity 16 during a molding operation. In the embodiment shown, the vents 18 extend from respective corners of the mold cavity 16 to corresponding corners of the mold 10 and the constricted portions 20 of the vents 18 are located adjacent respective corners of the mold cavity 16. The constricted portions 20 serve as relief areas during a molding operation, providing channeling relief at the corners of the mold cavity 16. As will be appreciated by those of ordinary skill in the art, the invention is not limited by the number of vents 18 or the layout of the vents 18. Fewer or more vents 18 may be provided in other arrangements in alternative embodiments.

Figure 3:
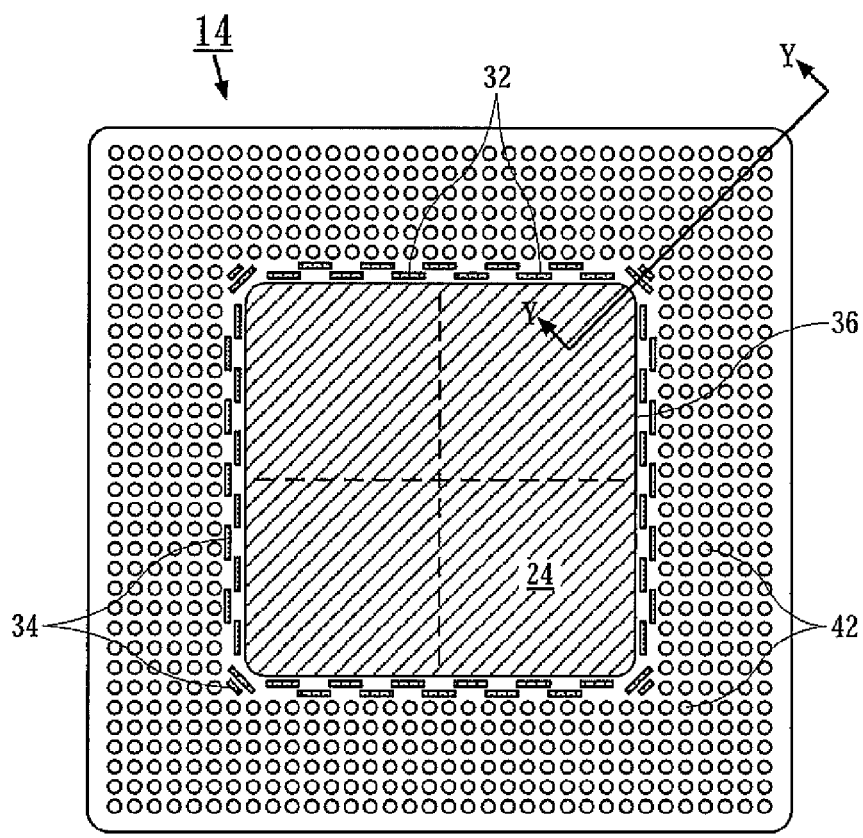
FIG. 3 is a schematic top plan view of a substrate on a second mold part in accordance with an embodiment of the present invention.

Referring now to FIG. 3, a schematic top plan view of the second mold part 14 and the substrate 24 is shown. A plurality of trenches or grooves 32, 34 is formed in the substrate 24.

The grooves 32, 34 are generally straight. Those at the sides of molding area 36 on the substrate 24 extend generally parallel to the edge of the molding area 36, and along only a small proportion of the length of the side of the molding area 36 (such as less than a quarter of the length). Those grooves 32, 34 at the corners extend diagonally, so as to be transverse to the vents 18. Nonetheless, as will be understood by those of ordinary skill in the art, the present invention is not limited by the number of grooves 32, 34 or the arrangement of the grooves 32, 34 shown. For example, the grooves 32, 34 may in alternative embodiments be formed at one or more corners and/or one or more sides of the molding area 36. In one embodiment, the grooves 32, 34 may be provided within the clamping areas of the mold 10 to increase its effectiveness in containing resin bleed.

Figure 4:
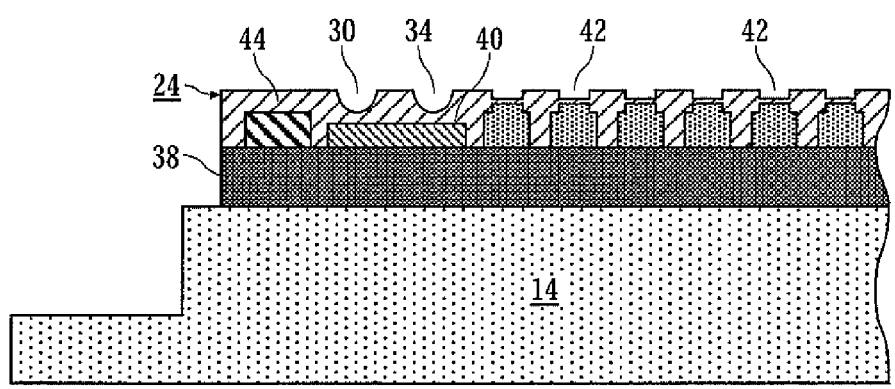
FIG. 4 is an enlarged partial cutaway view of the second mold part and the substrate of FIG. 3 along a line Y-Y.

Referring now to FIG. 4, an enlarged partial cutaway view of the second mold part 14 and the substrate 24 of FIG. 3 along a line Y-Y is shown. The substrate 24 includes a base substrate 38, an electrically conductive pattern including electrically conductive traces 40 and a plurality of electrically conductive pads 42 formed on the base substrate 38, and a solder mask or solder resist layer 44 formed on the base substrate 38 and a portion of the electrically conductive pattern 40.

The base substrate 38 may have a thickness of between about 50 microns (μm) and about 75 μm. The electrically conductive traces 40 and pads 42 may be made of copper (Cu) or other electrically conductive materials as are known in the art and commercially available. The solder resist layer 44 may be made of Photoimageable Solder Mask (PSR) and may have a thickness of about 20 μm. The electrically conductive traces 40 and pads 42 and the solder resist layer 44 may be formed on the base substrate 38 in a known manner, such as by deposition and etching and photolithography. Accordingly, further description of the formation of the electrically conductive traces 40 and pads 42 and the solder resist layer 44 is not required for a complete understanding of the present invention.

The grooves 32, 34 may be formed in a known manner, for example, by etching. Accordingly, further description of the manner in which the grooves 32, 34 are formed is not required for a complete understanding of the present invention. In the present embodiment, the grooves 32, 34 are formed with a curved inner surface. The curved grooves 32, 34 provide volumetric space to contain the mold compound or resin when a bleed occurs and thus serve as a resin bleed stopper. In the embodiment shown, the grooves 32, 34 are formed in the solder resist layer 44 above the electrically conductive traces 40. To prevent exposure of the electrically conductive traces 40, the grooves 32, 34 may be formed to a depth of between about 3 microns (μm) and about 7 μm. Correspondingly, to accommodate deeper grooves 32, 34, the electrically conductive traces 40 under the grooves 32, 34 may be etched about a third (⅓) lower than their typical or original thickness to, for example, a height of about 12 μm. Nonetheless, those of skill in the art will understand that the present invention is not limited by the depth of the grooves 32, 34, the height of the electrically conductive traces 40, or the position of the grooves 32, 34 in the substrate 24 relative to the electrically conductive traces 40. For example, the grooves 32, 34 may be etched into the base substrate 38 in an embodiment where the grooves 32, 34 are not formed above the electrically conductive traces 40.

Referring again to FIG. 3, to prevent the formation of cracks in and delamination of the solder resist layer 36, the grooves 32, 34 are formed in a staggered and overlapping arrangement around a periphery of the molding area 36 on the substrate 24. More particularly, the grooves 32, 34 are formed in a plurality of rows around the periphery of the molding area 36 on the substrate 24 such that first grooves 32 in a first row are staggered from second grooves 34 in a second row. That is, the centres of the grooves 32 are at different positions around the periphery of the molding area from the centres of the adjacent grooves 34. The staggered arrangement of the grooves 32, 34 prevents weakening of the solder resist layer 44 and thus prevents the formation of cracks in and/or delamination of the solder resist layer 44. Adjacent grooves 32, 34 overlap, so that any straight line drawn out of the molding area 36 perpendicular to the periphery of the molding area 36 intersects with at least one of the grooves 32, 34. Thus, mold compound leaking out of the cavity at any point around the periphery of the cavity will encounter one of the grooves 32, 34. Although only two (2) rows of grooves 32, 34 are illustrated in FIGS. 1, 3 and 4, it should nonetheless be understood by those of ordinary skill in the art that the present invention is not limited by the number of rows of grooves 32, 34 formed on the substrate 24. For instance, there may be three (3) or more rows of grooves 32, 34 on the substrate 24 in alternative embodiments.

Referring again to FIG. 1, at least some of the grooves 32, 34 on the substrate 24 are positioned in alignment with the corresponding constricted portion 20 of the vent 18 and lie in a direction transverse to the vent 18. A combination of the constricted portion 20 in the vent 18 and the grooves 32, 34 in the substrate 24 effectively reduces resin bleed. The mold compound 26 is contained within the constricted portion 20 of the vent 18 and does not bleed onto the electrically conductive pads 42 of the substrate 24. In one embodiment, the first mold part 12 and an upper surface of the solder resist layer 44 may be separated by a vertical distance of between about 20 μm and about 25 μm at the constricted portion 20 of the vent 18.

Figure 5:
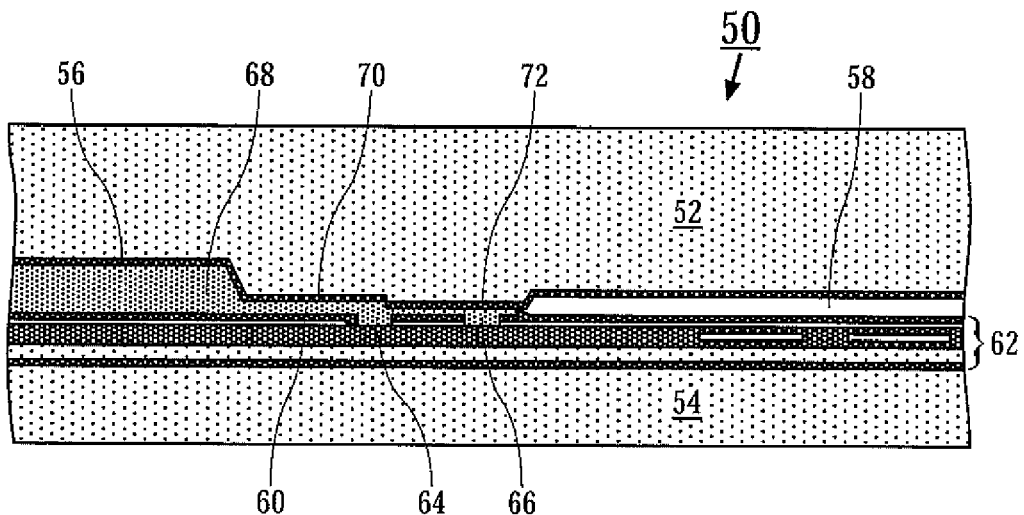
FIG. 5 is an enlarged cross-sectional view of a portion of a mold in accordance with another embodiment of the present invention.

Referring now to FIG. 5, an enlarged cross-sectional view of a portion of a mold 50 in accordance with another embodiment of the invention is shown. The mold 50 includes a first mold part 52 and a second mold part 54. A mold cavity 56 is defined between the first and second mold parts 52, 54. One or more vents 58, one of which is shown in FIG. 5, may be defined between the first and second mold parts 52, 54. The vent 58 extends from the mold cavity 56 to the outside of the mold 50, and includes a constricted portion 60 that communicates with the mold cavity 56. A substrate 62 is received in the mold 50. A plurality of trenches or grooves 64, 66 is formed in the substrate 62 and a portion of the substrate 62 is covered with a mold compound 68.

In the embodiment shown, the constricted portion 60 comprises first and second constrictions 70 and 72, the first constriction 70 being located nearer the mold cavity 56 than the second constriction 72. The second constriction 72 is narrower than the first 70. The provision of an additional constriction in the vent 58 increases the effectiveness of the constricted portion 60 in reducing mold flash or bleed. In one embodiment, the first mold part 52 and an upper surface of the substrate 62 may be separated by a first vertical distance of between about 25 μm and about 28 μm at the first constriction 70 and by a second vertical distance of between about 20 μm and about 23 μm at the second constriction 70. The first groove 64 on the substrate 62 is aligned with the first constriction 70 in the constricted portion 60 of the vent 58, and the second groove 66 is aligned with the second constriction 72 in the constricted portion 60 of the vent 58. As the mold 50 is largely similar to the mold 10 of FIG. 1, further detailed description of the mold 50 is not required for a complete understanding of the present invention.

Figure 6:
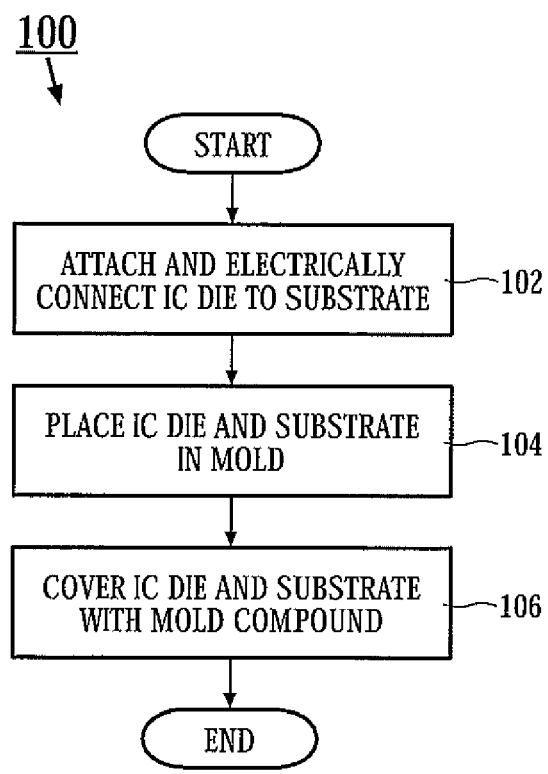
FIG. 6 is schematic flow diagram of a method of packaging an integrated circuit (IC) die in accordance with an embodiment of the present invention.

Referring now to FIG. 6, a schematic flow diagram of a method 100 of packaging an integrated circuit (IC) die using the mold 10 of FIG. 1 or the mold 50 of FIG. 5 is shown. The method 100 begins at step 102 with the attachment and electrical connection of the IC die to a substrate 24, 62 having a plurality of grooves 32, 34, 64, 66 formed thereon. The IC die is of a type well known to those of ordinary skill in the art, such as a processor chip, an application specific integrated circuit (ASIC), etc. Accordingly, further description of the IC die is not required for a complete understanding of the present invention. The IC die is attached and electrically connected to the substrate 24, 62 at step 102 in a known manner, for example, using die attach epoxy and wire bonding or flip chip process technology. The substrate 24, 62 serves as an electrical interface to the IC die. The IC die and the substrate 24, 62 are placed in the mold 10, 50 at step 104 and covered with a mold compound 26, 68 at step 106.

As is evident from the foregoing discussion, the present invention provides a mold and a substrate that increase center gate molding process robustness and resultant package reliability. As the air vents in the mold do not require additional air vent holes, frequent cleaning of the mold is not required. This makes the mold suitable for use in mass production. Further, by providing constricted portions in the vents and grooves in the substrate, mold flash and bleed may be effectively contained. Moreover, since vent relief is provided only at the corners of the mold cavity and not all around the mold cavity, the clamping area is not substantially reduced. This reduces the incidence of solder mask cracks arising from increases in clamping pressure experienced by the substrate.

The mold and the substrate may be used in the manufacture of ball grid array (BGA) products that require center gate molding. Advantageously, since the mold and the substrate can be easily fabricated by a mold vendor and a substrate supplier respectively, there is no need for additional capital investment.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of packaging an integrated circuit (IC) die, comprising:
    attaching and electrically connecting the IC die to a substrate having a plurality of grooves formed thereon in a staggered arrangement around the periphery of a molding area of the substrate;
    placing the IC die and the substrate into a mold cavity of a mold having a plurality of mold parts, wherein a vent extending away from the mold cavity is defined between the mold parts, and at least some of the grooves on the substrate intersect with the vent; and
    covering the IC die and the molding area of the substrate with a mold compound, wherein the mold compound is injected into the mold cavity by way of a center gate.

2. The method of packaging an IC die of claim 1, wherein said at least some of the grooves intersect with a constricted portion of the vent and extend in a direction transverse to a length direction of the vent.

3. The method of packaging an IC die of claim 2, further comprising:
    aligning a first groove on the substrate with a first constriction in the constricted portion of the vent and a second groove on the substrate with a second constriction in the constricted portion of the vent, wherein the second constriction is narrower than the first.

4. The method of packaging an IC die of claim 1, wherein the grooves have a depth of between about 3 μm to about 7 μm.

5. The method of packaging an IC die of claim 1, wherein the grooves are formed in a plurality of rows around the periphery of the molding area on the base substrate and first grooves in a first row are staggered from and overlap adjacent second grooves in a second row.

* * * * *